(12) United States Patent
Nakamura (10) Patent No.: US 10,756,310 B2
(45) Date of Patent: Aug. 25, 2020

(54) DISPLAY DEVICE

(71) Applicant: Sharp Kabushiki Kaisha, Sakai, Osaka (JP)

(72) Inventor: Kohzoh Nakamura, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/477,559

(22) PCT Filed: Sep. 29, 2017

(86) PCT No.: PCT/JP2017/035706
§ 371 (c)(1),
(2) Date: Jul. 12, 2019

(87) PCT Pub. No.: WO2019/064574
PCT Pub. Date: Apr. 4, 2019

(65) Prior Publication Data
US 2019/0363310 A1   Nov. 28, 2019

(51) Int. Cl.
*H01L 51/56* (2006.01)
*G09F 9/302* (2006.01)
*H01L 27/32* (2006.01)

(52) U.S. Cl.
CPC .............. *H01L 51/56* (2013.01); *G09F 9/302* (2013.01); *H01L 27/3218* (2013.01); *H01L 27/3276* (2013.01)

(58) Field of Classification Search
None
See application file for complete search history.

(56) References Cited

U.S. PATENT DOCUMENTS

| 6,366,025 | B1 | 4/2002 | Yamada |
| 2013/0234917 | A1* | 9/2013 | Lee ............... H01L 27/3216 345/82 |
| 2015/0364075 | A1 | 12/2015 | Sato et al. |

(Continued)

FOREIGN PATENT DOCUMENTS

| JP | 2001-290441 A | 10/2001 |
| JP | 2016-001290 A | 1/2016 |

(Continued)

OTHER PUBLICATIONS

Official Communication issued in International Patent Application No. PCT/JP2017/035706, dated Dec. 26, 2017.

*Primary Examiner* — Raj R Gupta
(74) *Attorney, Agent, or Firm* — Keating & Bennett, LLP (57) ABSTRACT

Provided is a display device including a first light emitting layer having an island shape, a second light emitting layer having an island shape, and a third light emitting layer having an island shape, between a lower electrode layer and an upper electrode layer. The first light emitting layer and the second light emitting layer are adjacent in a column direction, and the third light emitting layer is adjacent to the first light emitting layer and the second light emitting layer in a diagonal direction. The first light emitting layer emits blue light, one of the second light emitting layer and the third light emitting layer emits red light, and the other emits green light. A light emitting region of the first light emitting layer is larger than light emitting regions of the second light emitting layer and the third light emitting layer.

8 Claims, 10 Drawing Sheets

(56) References Cited

U.S. PATENT DOCUMENTS

| | | |
|---|---|---|
| 2016/0126295 A1* | 5/2016 | Sato ............... H01L 27/3213 257/89 |
| 2016/0155781 A1 | 6/2016 | Chaji |
| 2017/0033287 A1 | 2/2017 | Chida |
| 2017/0133626 A1 | 5/2017 | Senoo et al. |
| 2017/0317150 A1* | 11/2017 | Chung ............ H01L 27/3218 |

FOREIGN PATENT DOCUMENTS

| | | |
|---|---|---|
| JP | 2016-001294 A | 1/2016 |
| JP | 2017-033924 A | 2/2017 |
| JP | 2017-156598 A | 9/2017 |
| WO | 2016/002746 A1 | 1/2016 |

\* cited by examiner

DISPLAY DEVICE

TECHNICAL FIELD

The disclosure is related to a display device.

BACKGROUND ART

In PTL 1 there is disclosed an organic electroluminescent (EL) device in which red, blue, and green subpixels form a delta arrangement.

CITATION LIST

Patent Literature

PTL 1: JP 2016-1294 A (published on Jan. 7, 2016).

SUMMARY

Technical Problem

In the configuration in PTL 1, the blue subpixels are thinned, increasing a current density of a blue light emitting layer and resulting in the problem of increased susceptibility to deterioration over time.

Solution to Problem

A display device according to an aspect of the disclosure includes a first light emitting layer having an island shape, a second light emitting layer having an island shape, and a third light emitting layer having an island shape, between a lower electrode layer and an upper electrode layer. The first light emitting layer and the second light emitting layer are adjacent in a column direction, and the third light emitting layer is adjacent to the first light emitting layer and the second light emitting layer in a diagonal direction. The first light emitting layer is configured to emit blue light, one of the second light emitting layer and the third light emitting layer is configured to emit red light, and the other is configured to emit green light. A light emitting region of the first light emitting layer has a larger surface area than the surface areas of light emitting regions of the second light emitting layer and the third light emitting layer.

Advantageous Effects of Disclosure

According to the aspect of the disclosure, it is possible to keep the first light emitting layer that emits blue light from deteriorating over time.

DESCRIPTION OF EMBODIMENTS

Figure 1:
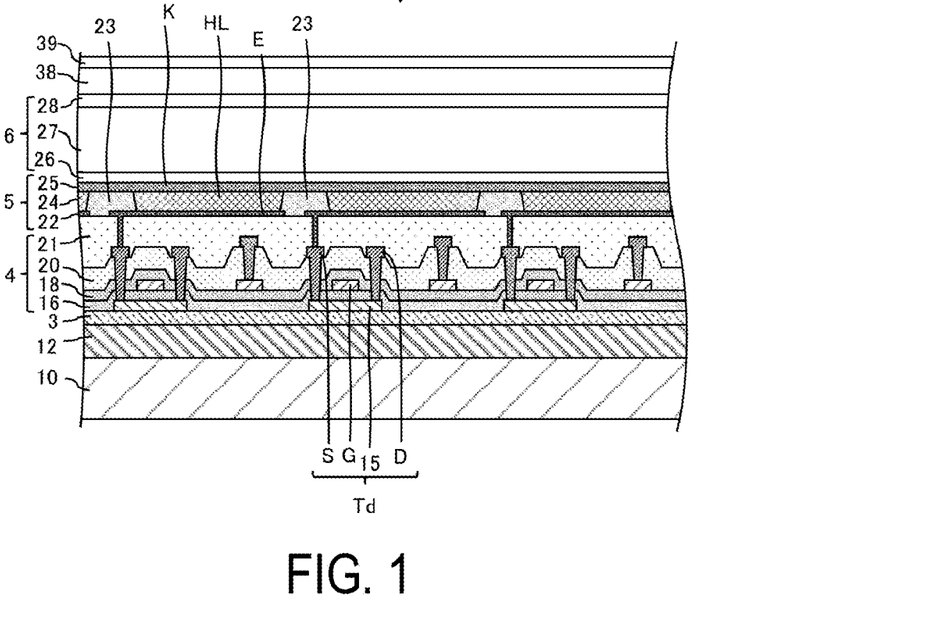
FIG. 1 is a cross-sectional view illustrating a configuration example of a display device.

FIG. 1 is a cross-sectional view illustrating a configuration example of a display device. A display device 2 of FIG. 1 is a top-emitting type that emits light upward, and includes a base material 10, a resin layer 12, a barrier layer 3 (undercoat layer), a thin-film transistor (TFT) 4, a light emitting element layer 5, a sealing layer 6, an adhesive layer 38, and a function film 39, in this order from a lower side.

Examples of the material of the base material 10 include polyethylene terephthalate (PET). Examples of the material of the resin layer 12 include polymide, epoxy, and polyamide.

The barrier layer 3 is a layer that inhibits moisture or impurities from reaching the TFT layer 4 or the light emitting element layer 5 when the display device 2 is being used, and can be constituted by a silicon oxide film, a silicon nitride film, or a silicon oxinitride film, or by a layered film of these, formed using chemical vapor deposition (CVD).

The TFT layer 4 includes a semiconductor film 15, an inorganic insulating film 16 formed in an upper layer overlying the semiconductor film 15, a gate electrode G in an upper layer overlying the inorganic insulating film 16, an inorganic insulating film 18 in an upper layer overlying the gate electrode G, a capacitance wiring line C in an upper layer overlying the inorganic insulating film 18, an inorganic insulating film 20 in an upper layer overlying the capacitance wiring line C, a source electrode S and a drain electrode D in an upper layer overlying the inorganic insulating film 20, and a flattening film 21 in an upper layer overlying the source electrode S and the drain electrode D.

A thin film transistor Td (light emission control transistor) is configured to include the semiconductor film 15, the inorganic insulating film 16 (the gate insulating film), and the gate electrode G. The source electrode S is connected to a source region of the semiconductor film 15, and the drain electrode D is connected to a drain region of the semiconductor film 15.

The semiconductor film 15 is formed of, for example, low temperature polysilicon (LTPS) or an oxide semiconductor. Note that, in FIG. 2, the TFT is illustrated that has a top gate structure in which the semiconductor film 15 is the channel, but the TFT may have a bottom gate structure (when the TFT channel is the oxide semiconductor, for example).

The inorganic insulating films 16, 18, and 20 can be constituted, for example, by a silicon oxide (SiOx) film or a silicon nitride (SiNx) film, or a layered film of these, formed using CVD. The flattening film (interlayer insulating film) 21 can be constituted, for example, by a coatable photosensitive organic material, such as a polyimide, an acrylic, or the like.

The gate electrode G, the source electrode S, and the drain electrode D are formed of a metal single layer film or a layered film including, for example, at least one of aluminum (Al), tungsten (W), molybdenum (Mo), tantalum (Ta), chromium (Cr), titanium (Ti), or copper (Cu).

The light emitting element layer 5 (organic light emitting diode layer, for example) includes a lower electrode layer 22 formed on the flattening film 21, a cover film 23 in an upper layer overlying the lower electrode layer 22, a light emitting layer HL in an upper layer overlying the cover film 23, and an upper electrode layer 25 in an upper layer overlying the light emitting layer HL. The light emitting element (organic light emitting diode (OLED), for example) is configured to include an anode (anode electrode) E of the lower electrode layer 22, the light emitting layer HL, and a cathode (cathode electrode) K of the upper electrode layer 25. The cover film 23 is a coatable photosensitive organic material, such as a polyimide, an epoxy, or an acrylic, and is patterned to cover an edge of the anode E.

The light emitting layer HL is formed overlapping an opening of the cover film 23 by vapor deposition or an ink-jet method, and an overlapping region of the opening of the cover film 23 (exposed face of the anode E) and the light emitting layer HL is a light emitting region of a subpixel. In the case that the light emitting element layer 5 is an OLED layer, for example, a hole injecting layer, a hole transport layer, the light emitting layer HL, an electron transport layer, and an electron injecting layer are layered on the exposed face of the anode E. Here, only the light emitting layer HL is illustrated.

The anode E is photoreflective and is formed by the layering of indium tin oxide (ITO) and an alloy containing Ag, for example. The cathode K can be constituted by a light-transmissive conductive material such as a MgAg alloy (a very thin film), ITO, or indium zinc oxide (IZO).

In a case that the light emitting element layer 5 is the OLED layer, positive holes and electrons are recombined inside the light emitting layer HL by a drive current between the anode E and the cathode K, and light is emitted as a result of excitons that are generated by the recombination falling into a ground state. Since the cathode K is light-transmissive and the anode E is light-reflective, the light emitted from the light emitting layer HL travels upwards and results in top emission.

The light emitting element layer 5 is not limited to OLED element configurations, and may be an inorganic light emitting diode or a quantum dot light emitting diode.

The sealing layer 6 is light-transmissive, and includes the inorganic sealing film 26 that covers the cathode electrode 25, an organic sealing film 27 formed in an upper layer overlying the inorganic sealing film 26, and an inorganic sealing film 28 that covers the organic sealing film 27. The inorganic sealing films 26, 28 may be made of a silicon oxide film, a silicon nitride film, a silicon oxynitride film, or a layered film of these, formed by CVD using a mask, for example. The organic sealing film 27 is a light-transmissive organic film thicker than the inorganic sealing films 26, 28 and can be constituted by a coatable organic material such as an acrylic. For example, after coating the first inorganic sealing film 26 with an ink containing such an organic material using the ink-jet method, the ink is cured by ultraviolet (UV) irradiation. The sealing layer 6 covers the light emitting element layer 5 and inhibits foreign matter, such as water and oxygen, from infiltrating to the light emitting element layer 5.

The function film 39 includes, for example, an optical compensation function, a touch sensor function, a protection function, or the like.

First Embodiment

In the following, for ease of explanation, a vertical direction of the drawing is referred to as a column direction, a horizontal direction of the drawing is referred to as a row direction, and a diagonal direction is relative to the row direction and the column direction. Note that the row direction, for example, may have a parallel relationship, an orthogonal relationship, or a diagonal relationship with one edge (one side) of the display device. Further, a subpixel is the smallest display component independently driven. A pixel is a subpixel group corresponding to one set of input signals (R signal, G signal, and B signal).

Figure 2:
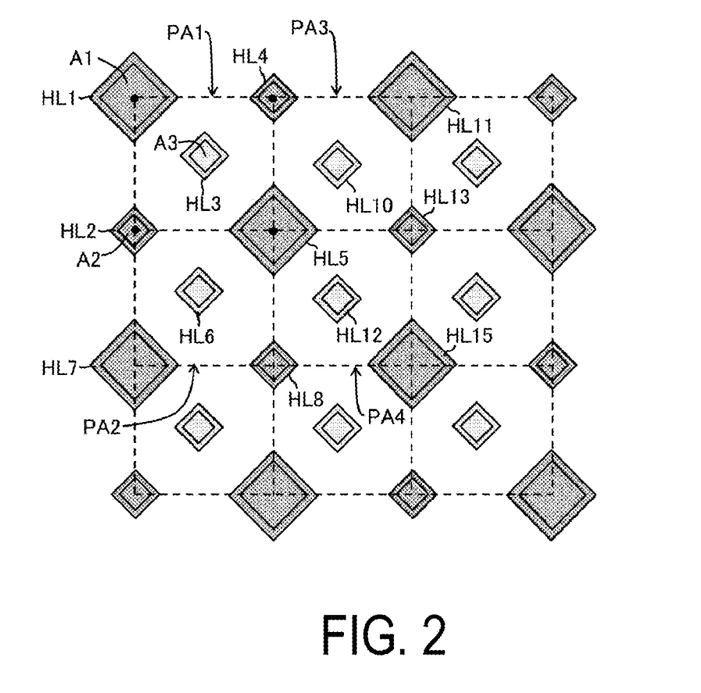
FIG. 2 is a plan view illustrating an arrangement of a light emitting layer and a light emitting region of a first embodiment.

FIG. 2 is a plan view illustrating an arrangement of a light emitting layer and a light emitting region of the first embodiment. In the display device of the first embodiment, a light emitting layer HL1 of blue light emission, a light emitting layer HL2 of red light emission, and a light emitting layer HL7 of blue light emission are arranged side-by-side in this order in the column direction, a light emitting layer HL4 of red light emission, a light emitting layer HL5 of blue light emission, and a light emitting layer HL8 of red light emission are arranged side-by-side in this order in the column direction, and a light emitting layer HL11 of blue light emission, a light emitting layer HL13 of red light emission, and a light emitting layer HL15 of blue light emission are arranged side-by-side in this order in the column direction.

Further, the light emitting layer HL1, the light emitting layer HL4, and the light emitting layer HL11 are arranged side-by-side in this order in the row direction, the light emitting layer HL2, the light emitting layer HL5, and the light emitting layer HL13 are arranged side-by-side in this order in the row direction, and the light emitting layer HL7, the light emitting layer HL8, and the light emitting layer HL15 are arranged side-by-side in this order in the row direction.

Further, the light emitting layer HL3 of green light emission is adjacent to the light emitting layer HL1, the light emitting layer HL2, the light emitting layer HL4, and the light emitting layer HL5 in the diagonal direction, the light emitting layer HL6 of green light emission is adjacent to the light emitting layer HL2, the light emitting layer HL7, the light emitting layer HL5, and the light emitting layer HL8 in the diagonal direction, the light emitting layer HL10 of green light emission is adjacent to the light emitting layer HL4, the light emitting layer HL5, the light emitting layer HL11, and the light emitting layer HL13 in the diagonal direction, and the light emitting layer HL12 of green light emission is adjacent to the light emitting layer HL5, the light emitting layer HL8, the light emitting layer HL13, and the light emitting layer HL15 in the diagonal direction.

In a planar view, pixel areas, each having a square shape, are arranged into a matrix, and centers of the light emitting layers HL1 (blue), HL2 (red), HL4 (red), HL5 (blue) are disposed at the four vertices of a pixel area PA1, and a center of the light emitting layer HL3 (green) matches a center of the pixel area PAL The centers of the light emitting layers HL2 (red), HL7 (blue), HL5 (blue), HL8 (red) are disposed at the four vertices of a pixel area PA2, and a center of the light emitting layer HL6 (green) matches a center of the pixel area PA2. The centers of the light emitting layers HL4 (red), HL5 (blue), HL11 (blue), HL13 (red) are disposed at the four vertices of a pixel area PA3, and a center of the light emitting layer HL10 (green) matches a center of the pixel area PA3. The centers of the light emitting layers HL5 (blue), HL8 (red), HL13 (red), HL15 (blue) are disposed at the four vertices of a pixel area PA4, and a center of the light emitting layer HL12 (green) matches a center of the pixel area PA4.

The light emitting layers each have an island shape overlapping with one anode, and a square shape (rhombic shape) having two diagonal lines in a row direction and a column direction, in a planar view. Note that the light emitting layers (HL2, HL4, and the like) of red light emission and the light emitting layers (HL3, HL6, and the like) of green light emission are substantially the same size, and the light emitting layers (HL1, HL5, HL7 and the like) of blue light emission are larger in size than the light emitting layers (HL2, HL4, and the like) of red light emission and the light emitting layers (HL3, HL6, and the like) of green light emission.

Figure 3A:
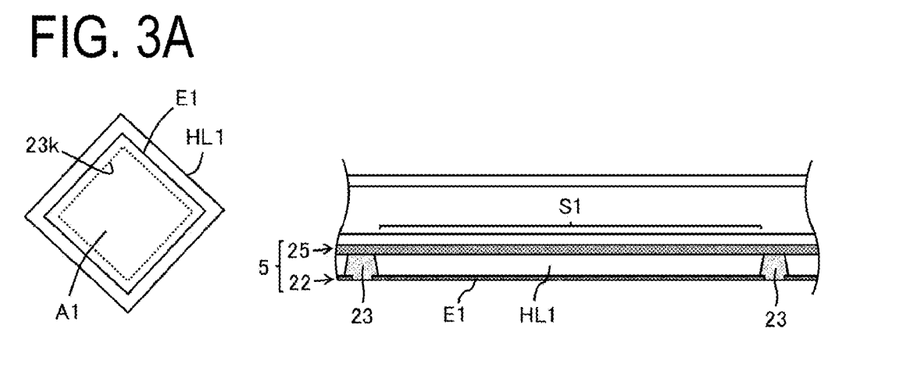
FIG. 3A is a plan view and a cross-sectional view illustrating a blue subpixel.
Figure 3B:
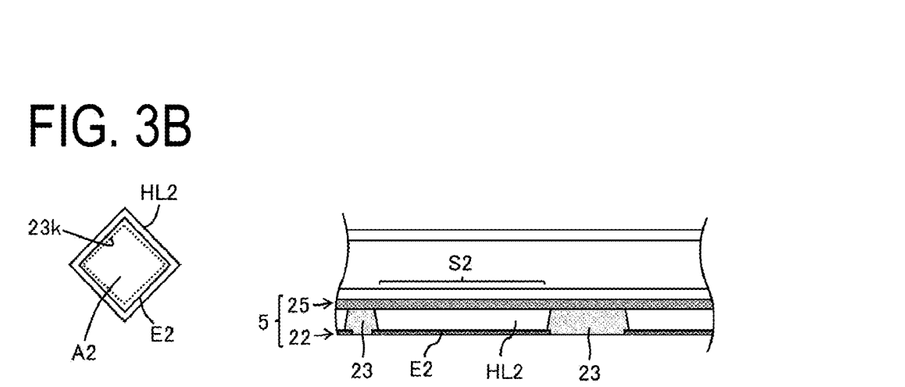
FIG. 3B is a plan view and a cross-sectional view illustrating a red subpixel.
Figure 3C:
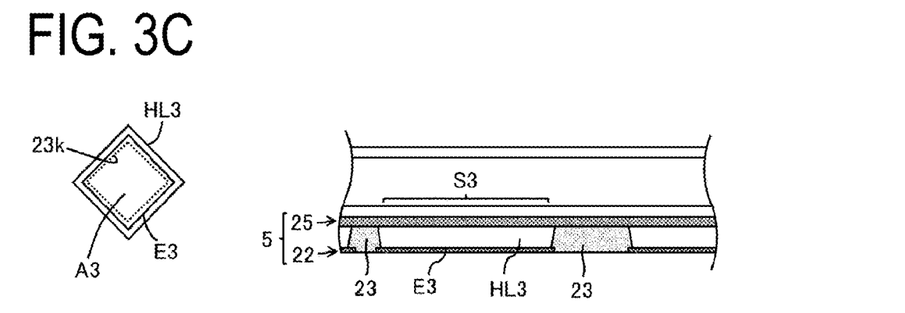
FIG. 3C is a plan view and a cross-sectional view illustrating a green subpixel.

FIG. 3A is a plan view and a cross-sectional view illustrating a blue subpixel, FIG. 3B is a plan view and a cross-sectional view illustrating a red subpixel, and FIG. 3C is a plan view and a cross-sectional view illustrating a green subpixel.

The light emitting layer HL1 of blue light emission overlaps with one anode E1. In a planar view, the anode E1 has a square shape (rhombus shape) having two diagonal lines in the row direction and the column direction, and is arranged within an edge of the light emitting layer HL1. The edge of the anode E1 is covered by the cover film 23 and, within the light emitting region HL1, a region overlapping with an exposed portion of the anode E1 (downward portion of the opening 23k of the cover film) is a light emitting region A1. A blue subpixel S1 is formed so as to include the anode E1 and the light emitting region A1 of the light emitting layer HL1.

The light emitting layer HL2 of red light emission overlaps with one anode E2. In a planar view, the anode E2 has a square shape (rhombus shape) having two diagonal lines in the row direction and the column direction, and is arranged within an edge of the light emitting layer HL2. The edge of the anode E2 is covered by the cover film 23 and, within the light emitting region HL2, a region overlapping with the exposed portion of the anode E2 (downward portion of the opening 23k of the cover film) is a light emitting region A2. A red subpixel S2 is formed so as to include the anode E2 and the light emitting region A2 of the light emitting layer HL2.

The light emitting layer HL3 of green light emission overlaps with one anode E3. In a planar view, the anode E3 has a square shape (rhombus shape) having two diagonal lines in the row direction and the column direction, and is arranged within an edge of the light emitting layer HL3. The edge of the anode E3 is covered by the cover film 23 and, within the light emitting region HL3, a region overlapping with the exposed portion of the anode E3 (downward portion of the opening 23k of the cover film) is a light emitting region A3. A red subpixel S3 is formed so as to include the anode E3 and the light emitting region A3 of the light emitting layer HL3.

The light emitting regions A1, A2, A3 each have a square shape (rhombus shape) having two diagonal lines in the row direction and the column direction, the light emitting regions A2, A3 (red and green) are the same size, and the light emitting region A1 (blue) is larger than the light emitting regions A2, A3.

Figure 4:
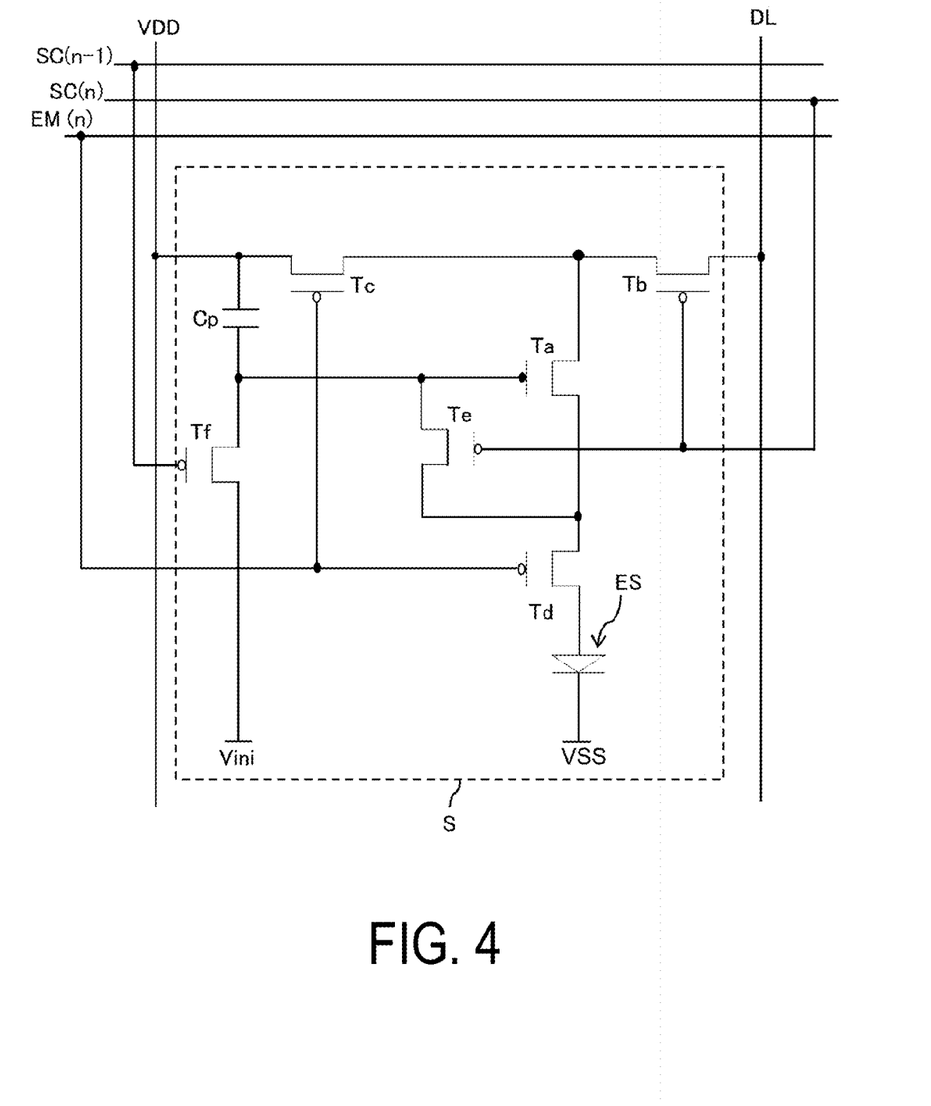
FIG. 4 is a circuit diagram illustrating a configuration example of a subpixel.

FIG. 4 is a circuit diagram illustrating a configuration example of a subpixel. The TFT layer 4 is provided with a plurality of data lines DL extending in the column direction, and a plurality of scanning lines SC(n) and a plurality of light emission control wiring lines EM(n) extending in the row direction. A subpixel S is connected to the data line DL and the scanning line SC(n). Note that a high level power source VDV and a low level power source VSS for driving the organic EL element, and an initialization voltage Vini are supplied to the subpixels S. During the period in which the scanning line SC(n) is active, a potential signal corresponding to display gray scale data is supplied to the subpixels connected thereto from the data line DL.

The subpixel S includes a driving transistor Ta, a switch transistor Tb, a power supply control transistor Tc, a light emission control transistor Td, a threshold voltage compensation transistor Te, an initialization transistor Tf, and a capacitor Cp formed in the TFT layer 4 of FIG. 1, and a light emitting element ES (organic light emitting diode, for example) including the anode E and the light emitting layer HL and formed in the light emitting element layer 5 of FIG. 1.

The driving transistor Ta includes a gate electrode which is connected with a source electrode of the threshold voltage compensation transistor Te, a drain electrode of the initialization transistor Tf, and one electrode of the capacitor Cp, a drain electrode which is connected with a source electrode of the switch transistor Tb and a source electrode of the power supply control transistor Tc, and a source electrode which is connected with a drain electrode of the light emission control transistor Td and a drain electrode of the threshold voltage compensation transistor Te.

The switch control transistor Tb includes a gate terminal connected with the scanning line SC(n) of the n-th row, a drain electrode connected with the data line DL, and the source electrode which is connected with the drain electrode of the drive transistor Ta and the source electrode of the power supply control transistor Tc. The power supply control transistor Tc includes a gate electrode connected with the light emission control line EM(n) of the n-th row, a drain electrode which is connected with the supply line of the high level power source VDD and the other electrode of the capacitor Cp, and the source electrode which is connected with the drain electrode of the drive transistor Ta and the source electrode of the switch control transistor Tb.

The anode of the light emitting element ES is connected to the drain electrode of the light emission control transistor Td, and the cathode of the light emitting element ES is connected to the supply line of the low level power source VSS.

Figure 5:
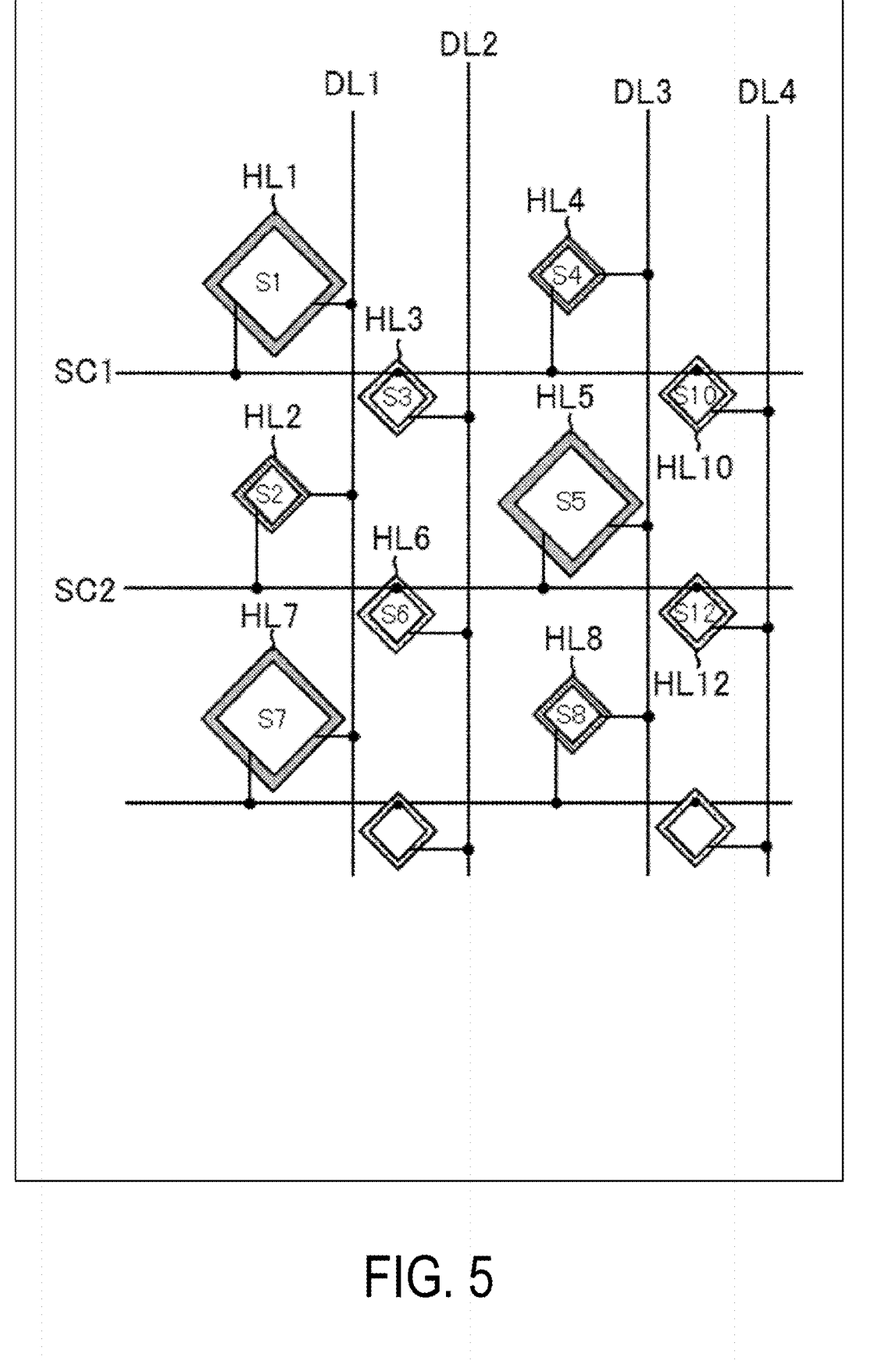
FIG. 5 is a schematic view illustrating a connection relationship between the subpixel, a scanning line, and a data line of the first embodiment.

FIG. 5 is a schematic view illustrating a connection relationship between the subpixel, a scanning line, and a data line of the first embodiment. Similar to the blue subpixel S1, the red subpixel S2, and the green subpixel S3 illustrated in FIGS. 3A to 3C, a red subpixel S4 includes the light emitting layer HL4, a blue subpixel S5 includes the light emitting layer HL5, a green subpixel S6 includes the light emitting layer HL6, a blue subpixel S7 includes the light emitting layer HL7, a red subpixel S8 includes the light emitting layer HL8, a green subpixel S10 includes the light emitting layer HL10, and a green subpixel S12 includes the light emitting layer HL12.

The subpixels S1, S2, S7 are connected to a data line DL1, the subpixels S3, S6 are connected to a data line DL2, the subpixels S4, S5, S8 are connected to a data line DL3, and the subpixels S10, S12 are connected to a data line DL4. Further, the subpixels S1, S3, S4, S10 are connected to a scanning line SC1, and the subpixels S2, S6, S5, S12 are connected to a scanning line SC2. Note that a subpixel ratio (SPR; number of subpixels per pixel/3) is 2/3.

According to the first embodiment, it is possible to enlarge the light emitting region of the blue light emitting layer (generally more susceptible to deterioration than the red and green light emitting layers) while suppressing vapor deposition defects given an equivalent of two light emitting layers formed in one pixel area (0.5 blue light emitting layers, 0.5 red light emitting layers, and 1 green light emitting layer). For example, while ¼ of the blue light emitting layer HL1, ¼ of the blue light emitting layer HL5, ¼ of the red light emitting layer HL2, ¼ of the red light emitting layer HL4, and 1/1 (a whole) green light emitting layer HL3 are formed in the one pixel area PA1, the blue light emitting layers HL1, HL5 have a larger light emitting region than those of the red light emitting layers HL2, HL4 and the green light emitting layer HL3, making it possible to decrease a luminance per unit surface area (decrease a current density) and suppress deterioration of the blue light emitting layer.

Second Embodiment

Figure 6:
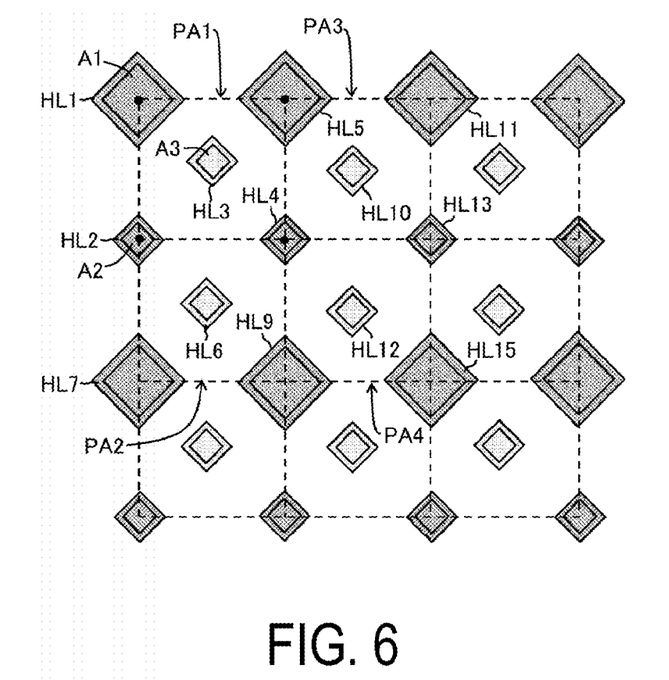
FIG. 6 is a plan view illustrating an arrangement of the light emitting layer and the light emitting region of a second embodiment.

While the light emitting layer of blue light emission and the light emitting layer of red light emission are alternately arranged in the row direction in the first embodiment, the disclosure is not limited thereto. FIG. 6 is a plan view illustrating an arrangement of the light emitting layer and the anode of a second embodiment.

In the second embodiment, the light emitting layer HL1 of blue light emission, the light emitting layer HL2 of red light emission, and the light emitting layer HL7 of blue light emission are arranged side-by-side in this order in the column direction, the light emitting layer HL5 of blue light emission, the light emitting layer HL4 of red light emission, and the light emitting layer HL9 of blue light emission are arranged side-by-side in this order in the column direction, and the light emitting layer HL11 of blue light emission, the light emitting layer HL13 of red light emission, and the light emitting layer HL15 of blue light emission are arranged side-by-side in this order in the column direction.

Further, the light emitting layer HL1, the light emitting layer HL5, and the light emitting layer HL11 of blue light emission are arranged side-by-side in this order in the row direction, the light emitting layer HL2, the light emitting layer HL4, and the light emitting layer HL13 of red light emission are arranged side-by-side in this order in the row direction, and the light emitting layer HL7, the light emitting layer HL9, and the light emitting layer HL15 of blue light emission are arranged side-by-side in this order in the row direction.

Further, the light emitting layer HL3 of green light emission is adjacent to the light emitting layer HL1, the light emitting layer HL2, the light emitting layer HL4, and the light emitting layer HL5 in the diagonal direction, the light emitting layer HL6 of green light emission is adjacent to the light emitting layer HL2, the light emitting layer HL7, the light emitting layer HL4, and the light emitting layer HL9 in the diagonal direction, the light emitting layer HL10 of green light emission is adjacent to the light emitting layer HL4, the light emitting layer HL5, the light emitting layer HL11, and the light emitting layer HL13 in the diagonal direction, and the light emitting layer HL12 of green light emission is adjacent to the light emitting layer HL4, the light emitting layer HL9, the light emitting layer HL13, and the light emitting layer HL15 in the diagonal direction.

Figure 7:
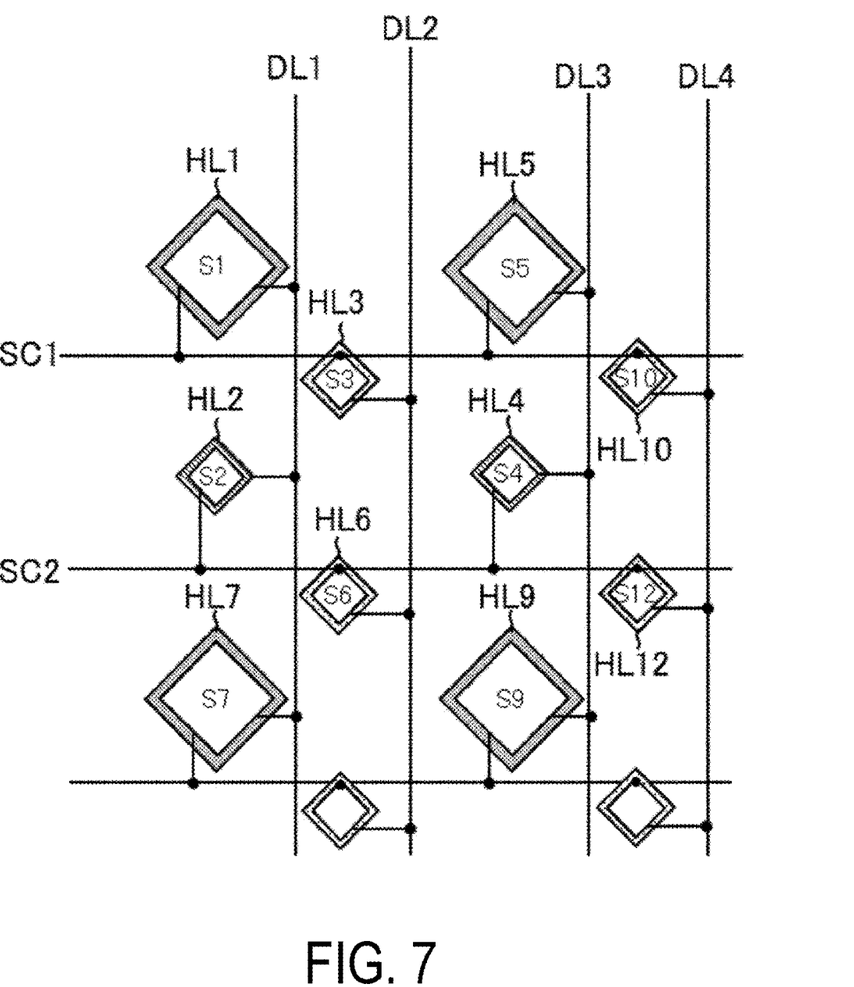
FIG. 7 is a schematic view illustrating the connection relationship between the subpixel, the scanning line, and the data line of the second embodiment.

FIG. 7 is a schematic view illustrating the connection relationship between the subpixel, the scanning line, and the data line of the second embodiment. The blue subpixel S1 includes the light emitting layer HL1, the red subpixel S2 includes the light emitting layer HL2, the green subpixel S3 includes the light emitting layer HL3, the red subpixel S4 includes the light emitting layer HL4, the blue subpixel S5 includes the light emitting layer HL5, the green subpixel S6 includes the light emitting layer HL6, the blue subpixel S7 includes the light emitting layer HL7, the blue subpixel S9 includes the light emitting layer HL9, the green subpixel S10 includes the light emitting layer HL10, and the green subpixel S12 includes the light emitting layer HL12.

The subpixels S1, S2, S7 are connected to the data line DL1, the subpixels S3, S6 are connected to the data line DL2, the subpixels S4, S5, S9 are connected to the data line DL3, and the subpixels S10, S12 are connected to the data line DL4. Further, the subpixels S1, S3, S5, S10 are connected to the scanning line SC1, and the subpixels S2, S6, S4, S12 are connected to the scanning line SC2. Note that the subpixel ratio (SPR; number of subpixels per pixel/3) is 2/3.

Third Embodiment

Figure 8:
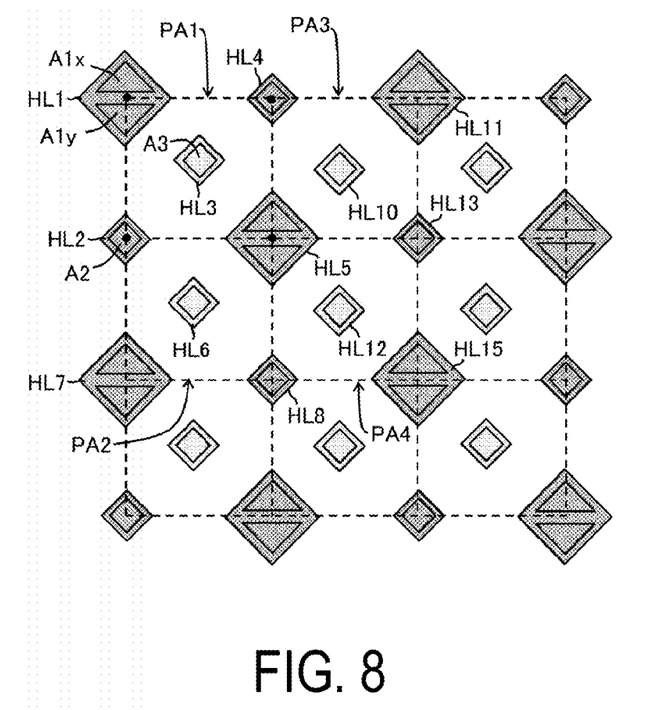
FIG. 8 is a plan view illustrating an arrangement of the light emitting layer and the light emitting region of a third embodiment.

FIG. 8 is a plan view illustrating an arrangement of the light emitting layer and the anode of a third embodiment. In the display device of the third embodiment, the light emitting layer HL1 of blue light emission, the light emitting layer HL2 of red light emission, and the light emitting layer HL7 of blue light emission are arranged side-by-side in this order in the column direction, the light emitting layer HL4 of red light emission, the light emitting layer HL5 of blue light emission, and the light emitting layer HL8 of red light emission are arranged side-by-side in this order in the column direction, and the light emitting layer HL11 of blue light emission, the light emitting layer HL13 of red light emission, and the light emitting layer HL15 of blue light emission are arranged side-by-side in this order in the column direction.

Further, the light emitting layer HL1, the light emitting layer HL4, and the light emitting layer HL11 are arranged side-by-side in this order in the row direction, the light emitting layer HL2, the light emitting layer HL5, and the light emitting layer HL13 are arranged side-by-side in this order in the row direction, and the light emitting layer HL7, the light emitting layer HL8, and the light emitting layer HL15 are arranged side-by-side in this order in the row direction.

Further, the light emitting layer HL3 of green light emission is adjacent to the light emitting layer HL1, the light emitting layer HL2, the light emitting layer HL4, and the light emitting layer HL5 in the diagonal direction, the light emitting layer HL6 of green light emission is adjacent to the light emitting layer HL2, the light emitting layer HL7, the light emitting layer HL5, and the light emitting layer HL8 in the diagonal direction, the light emitting layer HL10 of green light emission is adjacent to the light emitting layer HL4, the light emitting layer HL5, the light emitting layer HL11, and the light emitting layer HL13 in the diagonal direction, and the light emitting layer HL12 of green light emission is adjacent to the light emitting layer HL5, the light emitting layer HL8, the light emitting layer HL13, and the light emitting layer HL15 in the diagonal direction.

In a planar view, the pixel areas, each having a square shape, are arranged into a matrix, and the centers of the light emitting layers HL1 (blue), HL2 (red), HL4 (red), HL5 (blue) are disposed at the four vertices of the pixel area PA1, and the center of the light emitting layer HL3 (green) matches the center of the pixel area PA1. The centers of the light emitting layers HL2 (red), HL7 (blue), HL5 (blue), HL8 (red) are disposed at the four vertices of the pixel area PA2, and the center of the light emitting layer HL6 (green) matches the center of the pixel area PA2. The centers of the light emitting layers HL4 (red), HL5 (blue), HL11 (blue), HL13 (red) are disposed at the four vertices of the pixel area PA3, and the center of the light emitting layer HL10 (green) matches the center of the pixel area PA3. The centers of the light emitting layers HL5 (blue), HL8 (red), HL13 (red), HL15 (blue) are disposed at the four vertices of the pixel area PA4, and the center of the light emitting layer HL12 (green) matches the center of the pixel area PA4.

The light emitting layers are each island-like and have a rhombic shape with two diagonal lines in the row direction and the column direction. Note that the light emitting layers of red light emission and the light emitting layers of green light emission are substantially the same size, and the light emitting layers of blue light emission are larger in size than the light emitting layers of red light emission and the light emitting layers of green light emission.

In the third embodiment, in each of the light emitting layers (HL1, HL5, HL7, HL11, HL15) of blue light emission, two electrically independent anodes overlap.

Figure 9A:
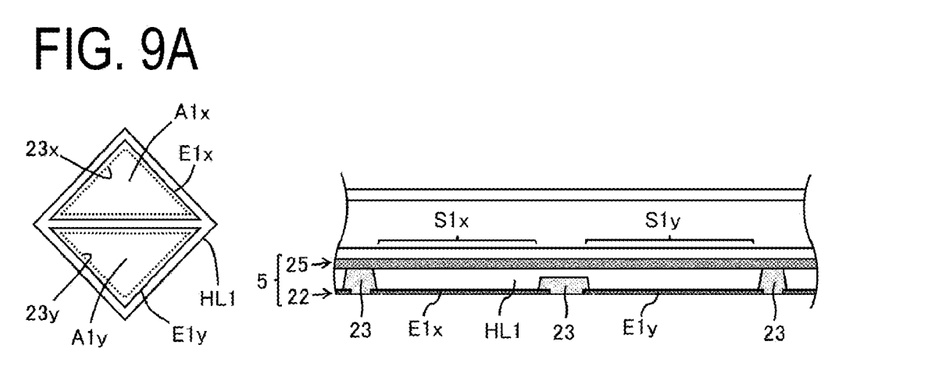
FIG. 9A is a plan view and a cross-sectional view illustrating the blue subpixel.
Figure 9B:
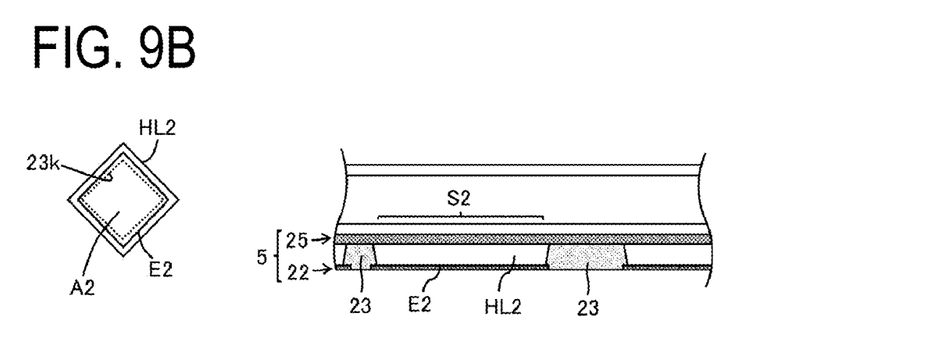
FIG. 9B is a plan view and a cross-sectional view illustrating the red subpixel.
Figure 9C:
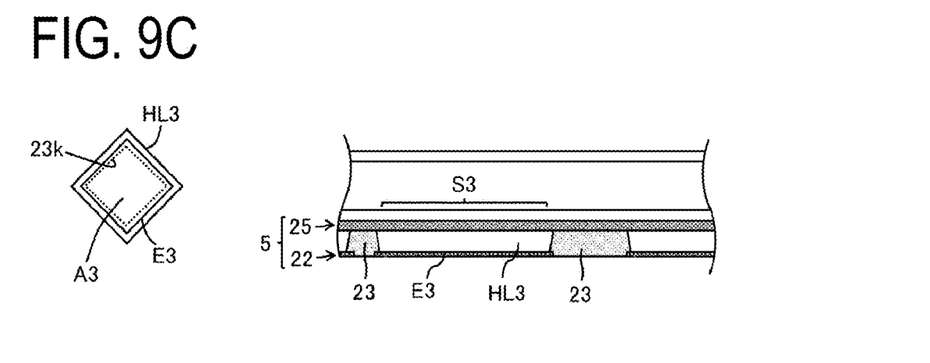
FIG. 9C is a plan view and a cross-sectional view illustrating the green subpixel.

FIG. 9A is a plan view and a cross-sectional view illustrating the blue subpixel, FIG. 9B is a plan view and a cross-sectional view illustrating the red subpixel, and FIG. 9C is a plan view and a cross-sectional view illustrating the green subpixel.

The light emitting layer HL1 of blue light emission overlaps with two anodes E1x, E1y. In the planar view, the anodes E1x, E1y are both isosceles right triangles, and are axially symmetrical so that bottom sides are adjacent in the column direction inside the edge of the light emitting layer HL1.

The light emitting layer HL1 is formed so as to extend over the cover film 23 covering the respective edges of the two anodes E1x, E1y, and overlap with an exposed portion of the anode E1x (downward portion of an opening 23x of the cover film) and an exposed portion of the anode E1y (downward portion of an opening 23y of the cover film). That is, the light emitting layer HL1 includes a light emitting region A1x overlapping with the exposed portion of the anode E1x (downward portion of the opening 23x of the cover film) and a light emitting region A1y overlapping with the exposed portion of the anode E1y (downward portion of the opening 23y of the cover film). A blue subpixel S1x is formed to include the anode E1x and the light emitting region A1x of the light emitting layer HL1, a blue subpixel S1y is formed to include the anode E1y and the light emitting region A1y of the light emitting layer HL1, and these subpixels S1x, S1y are separately driven.

The light emitting layer HL2 of red light emission overlaps with the one anode E2. In a planar view, the anode E2 has a square shape (rhombus shape) having two diagonal lines in the row direction and the column direction, and is arranged within the edge of the light emitting layer HL2. The edge of the anode E2 is covered by the cover film 23 and, within the light emitting region HL2, the region overlapping with the exposed portion of the anode E2 (downward portion of the opening 23k of the cover film) is the light emitting region A2. The red subpixel S2 is formed so as to include the anode E2 and the light emitting region A2 of the light emitting layer HL2.

The light emitting layer HL3 of green light emission overlaps with one anode E3. In a planar view, the anode E3 has a square shape (rhombus shape) having two diagonal lines in the row direction and the column direction, and is arranged within the edge of the light emitting layer HL3. The edge of the anode E3 is covered by the cover film 23 and, within the light emitting region HL3, the region overlapping with the exposed portion of the anode E3 (downward portion of the opening 23k of the cover film) is the light emitting region A3. The red subpixel S3 is formed so as to include the anode E3 and the light emitting region A3 of the light emitting layer HL3.

The light emitting regions A1x, A1y are both isosceles right triangles, and are axially symmetrical so that bottom sides are adjacent in the column direction. The light emitting regions A2, A3 are each square (rhombus) shaped with two diagonal lines in the row direction and the column direction. The light emitting region A2 (red) of the light emitting layer HL2 and the light emitting region A3 of the light emitting layer HL3 (green) are the same size, and the light emitting region (A1x, A1y) of the blue light emitting layer HL1 is larger than the light emitting region (A2) of the red light emitting layer HL2 and the light emitting region (A3) of the green light emitting layer HL3.

Figure 10:
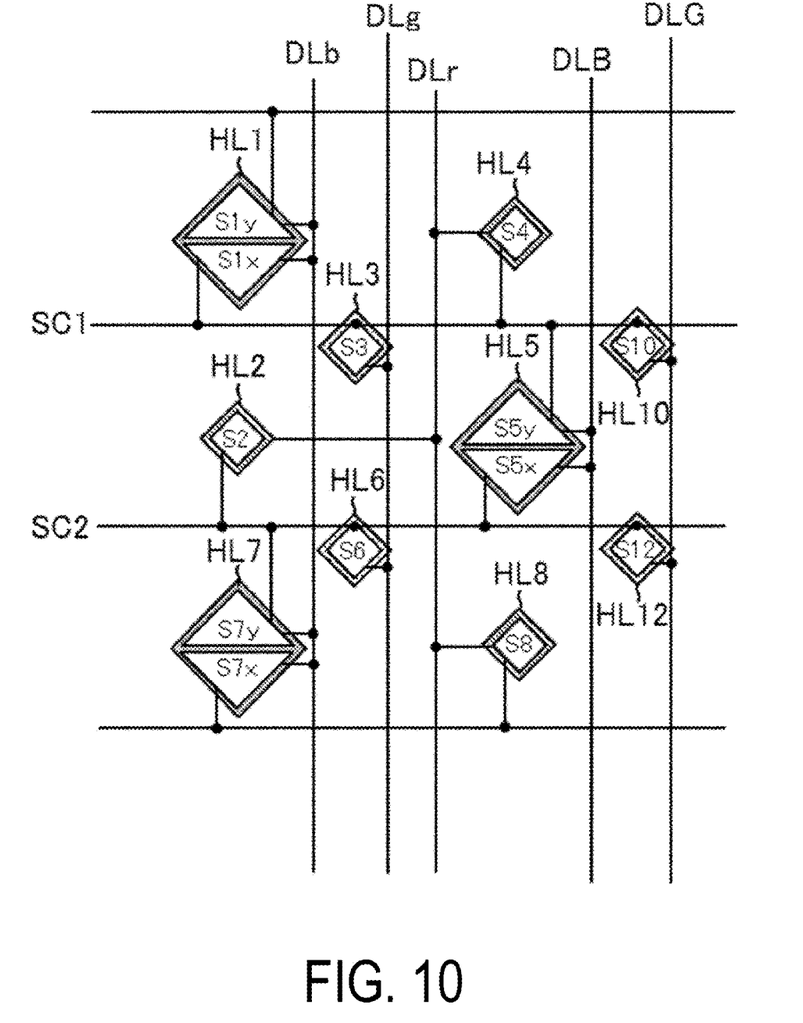
FIG. 10 is a schematic view illustrating the connection relationship between the subpixel, the scanning line, and the data line of the third embodiment.

FIG. 10 is a schematic view illustrating the connection relationship between the subpixel, the scanning line, and the data line of the third embodiment. Similar to the blue subpixels S1x, S1y, the red subpixel S2, and the green subpixel S3 illustrated in FIGS. 9A to 9C, the red subpixel S4 includes the light emitting layer HL4, blue subpixels S5x, S5y include the light emitting layer HL5, the green subpixel S6 includes the light emitting layer HL6, blue subpixels S7x, S1y include the light emitting layer HL7, the red subpixel S8 includes the light emitting layer HL8, the green subpixel S10 includes the light emitting layer HL10, and the green subpixel S12 includes the light emitting layer HL12.

The blue subpixels S1x, S1y, S7x, S1y are connected to a data line DLb, the red subpixels S2, S4, S8 are connected to a data line DLr, the green subpixel S3, S6 are connected to a data line DLg, the blue subpixels S5x, S5y are connected to a data line DLB, the green subpixels S10, S12 are connected to a data line DLG. Further, the subpixels S1x, S3, S4, S5y, S10 are connected to the scanning line SC1, and the subpixels S2, S7y, S6, S5x, S12 are connected to the scanning line SC2. The SPR ratio (number of subpixels per pixel/3) is 5/6.

According to the third embodiment, it is possible to enlarge the light emitting region of the blue light emitting layer (generally more susceptible to deterioration than the red and green light emitting layers) while suppressing vapor deposition defects given an equivalent of two light emitting layers formed in one pixel area (0.5 blue light emitting layers, 0.5 red light emitting layers, and 1 green light emitting layer). Further, one light emitting region is shared between two blue subpixels adjacent to each other, making it possible to realize a high resolution of an SPR ratio of 5/6.

Fourth Embodiment

Figure 11:
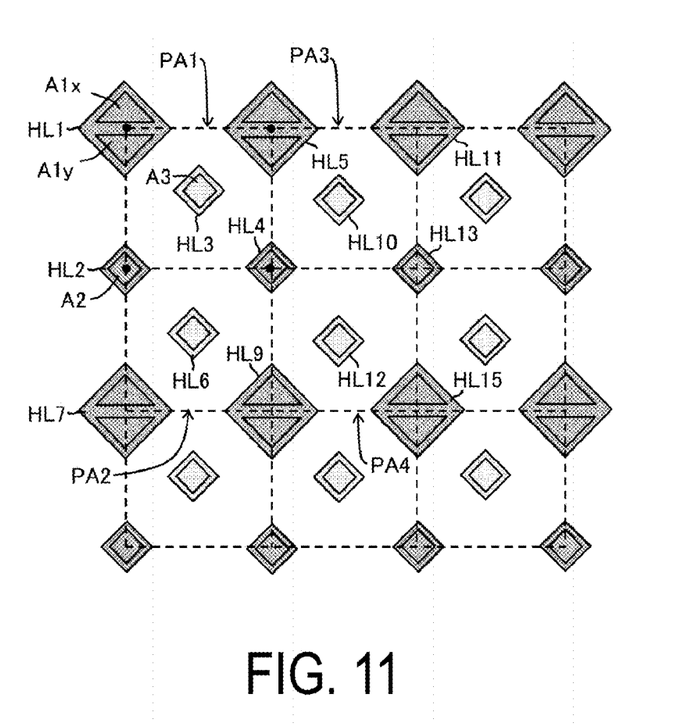
FIG. 11 is a plan view illustrating an arrangement of the light emitting layer and the light emitting region of a fourth embodiment.

FIG. 11 is a plan view illustrating an arrangement of the light emitting layer and the light emitting region of a fourth embodiment. In the fourth embodiment, the light emitting layers are arranged as in the second embodiment and, in each of the light emitting layers (HL1, HL5, HL7, HL11, HL15) of blue light emission, two electrically independent anodes overlap. As a result, two light emitting regions are formed in the blue light emitting layer, and are larger than the light emitting regions of the red light emitting layer and the green light emitting layer. For example, the light emitting region A2 (A1$x$, A1$y$) of the blue light emitting layer HL1 is larger than the light emitting region (A2) of the red light emitting layer HL2 and the light emitting region (A3) of the green light emitting layer HL3.

Supplement

An electro-optical element (an electro-optical element whose luminance and transmittance are controlled by an electric current) that is provided in the display device 2 according to the present embodiment is not particularly limited. Examples of the display device 2 according to the present embodiment include an organic EL display provided with the OLED as the electro-optical element, an inorganic EL display provided with an inorganic light emitting diode as the electro-optical element, and a quantum dot light emitting diode (QLED) display provided with a QLED as the electro-optical element.

The disclosure is not limited to the embodiments stated above. Embodiments obtained by appropriately combining technical approaches stated in each of the different embodiments also fall within the scope of the technology of the disclosure. Moreover, novel technical features may be formed by combining the technical approaches stated in each of the embodiments.

Aspect 1

A display device including:

a first light emitting layer having an island shape, a second light emitting layer having an island shape, and a third light emitting layer having an island shape, between a lower electrode layer and an upper electrode layer, wherein the first light emitting layer and the second light emitting layer are adjacent in a column direction, and the third light emitting layer is adjacent to the first light emitting layer and the second light emitting layer in a diagonal direction, the first light emitting layer is configured to emit blue light, one of the second light emitting layer and the third light emitting layer is configured to emit red light, and the other is configured to emit green light, and a light emitting region of the first light emitting layer is larger than light emitting regions of the second light emitting layer and the third light emitting layer.

Aspect 2

The display device according to aspect 1, for example, wherein the light emitting regions of the second light emitting layer and the third light emitting layer are of the same size.

Aspect 3

The display device according to aspect 1 or 2, for example, wherein the second light emitting layer is configured to emit red light, and the third light emitting layer is configured to emit green light.

Aspect 4

The display device according to any one of aspects 1 to 3, for example, wherein an equivalent of two light emitting layers is included in one pixel area.

Aspect 5

The display device according to any one of aspects 1 to 4, for example, wherein the first light emitting layer, the second light emitting layer, and the third light emitting layer each have a square shape with diagonal lines parallel in a row direction and diagonal lines parallel in the column direction, in a planar view.

Aspect 6

The display device according to any one of aspects 1 to 5, for example, wherein the first light emitting layer, the second light emitting layer, and the third light emitting layer overlap with respective corresponding electrodes inside the lower electrode layer, and a subpixel including one of the corresponding electrodes overlapping with the first light emitting layer and a subpixel including one of the corresponding electrodes overlapping with the third light emitting layer are connected to a same scanning signal line.

Aspect 7

The display device according to any one of aspects 1 to 5, for example, wherein the first light emitting layer overlaps with two electrodes included in the lower electrode layer.

Aspect 8

The display device according to aspect 7, for example, further including:

a cover film configured to cover respective edges of the two electrodes, wherein the first light emitting layer overlaps with a portion of one of the two electrodes not covered by the cover film, and with a portion of the other of the two electrodes not covered by the cover film.

Aspect 9

The display device according to aspect 8, for example, further including:

a subpixel including one and a subpixel including the other of the two electrodes overlapping with the first light emitting layer, wherein separate image signals are configured to be inputted to these two subpixels.

Aspect 10

The display device according to aspect 9, for example, wherein the two subpixels are arranged side-by-side along a same data signal line, and are connected to the data signal line.

Aspect 11

The display device according to aspect 3, for example, further including:

a fourth light emitting layer having an island shape and a fifth light emitting layer having an island shape, adjacent in a column direction, wherein the fourth light emitting layer is configured to emit red light, and the fifth light emitting layer is configured to emit blue light, one of the fourth light emitting layer and the fifth light emitting layer is adjacent to the first light emitting layer in the row direction, and the other is adjacent to the second light emitting layer in a row direction, and the third light emitting layer is adjacent to the fourth light emitting layer and the fifth light emitting layer in the diagonal direction.

Aspect 12

The display device according to aspect 11, for example, wherein the first light emitting layer and the fourth light emitting layer are adjacent in the row direction, and the second light emitting layer and the fifth light emitting layer are adjacent in the row direction.

Aspect 13

The display device according to aspect 12, for example, wherein the second light emitting layer and the fourth light emitting layer overlap with respective corresponding electrodes inside the lower electrode layer, and a subpixel including one of the corresponding electrodes overlapping with the second light emitting layer and a subpixel including one of the corresponding electrodes overlapping with the fourth light emitting layer are connected to a same data signal line for red.

REFERENCE SIGNS LIST

2 Display device
4 TFT layer
5 Light emitting element layer
6 Sealing layer
22 Lower layer electrode
23 Cover film
25 Upper layer electrode
HL1 Light emitting layer (first light emitting layer)
HL2 Light emitting layer (second light emitting layer)
HL3 Light emitting layer (third light emitting layer)
E Anode (electrode)
S Subpixel

The invention claimed is:

1. A display device comprising:
a first light emitting layer having an island shape, a second light emitting layer having an island shape, and a third light emitting layer having an island shape, between a lower electrode layer and an upper electrode layer,
wherein the first light emitting layer and the second light emitting layer are adjacent in a column direction, and the third light emitting layer is adjacent to the first light emitting layer and the second light emitting layer in a diagonal direction,
the first light emitting layer is configured to emit blue light, one of the second light emitting layer and the third light emitting layer is configured to emit red light, and the other is configured to emit green light,
a light emitting region of the first light emitting layer is larger than light emitting regions of the second light emitting layer and the third light emitting layer,
the first light emitting layer, the second light emitting layer, and the third light emitting layer overlap with respective corresponding electrodes inside the lower electrode layer, and
a subpixel including one of the corresponding electrodes overlapping with the first light emitting layer, and a subpixel including one of the corresponding electrodes overlapping with the third light emitting layer are connected to a same scanning signal line.

2. The display device according to claim 1, wherein the light emitting regions of the second light emitting layer and the third light emitting layer are of the same size.

3. The display device according to claim 1, wherein the second light emitting layer is configured to emit red light, and the third light emitting layer is configured to emit green light.

4. The display device according to claim 3, further comprising:
a fourth light emitting layer having an island shape and a fifth light emitting layer having an island shape, adjacent in the column direction,
wherein the fourth light emitting layer is configured to emit red light, and the fifth light emitting layer is configured to emit blue light,
one of the fourth light emitting layer and the fifth light emitting layer is adjacent to the first light emitting layer in a row direction, and the other is adjacent to the second light emitting layer in the row direction, and
the third light emitting layer is adjacent to the fourth light emitting layer and the fifth light emitting layer in the diagonal direction.

5. The display device according to claim 4, wherein the first light emitting layer and the fourth light emitting layer are adjacent in the row direction, and the second light emitting layer and the fifth light emitting layer are adjacent in the row direction.

6. The display device according to claim 5, wherein the second light emitting layer and the fourth light emitting layer overlap with respective corresponding electrodes inside the lower electrode layer, and
a subpixel including one of the corresponding electrodes overlapping with the second light emitting layer and a subpixel including one of the corresponding electrodes overlapping with the fourth light emitting layer are connected to a same data signal line for red.

7. The display device according to claim 1, wherein an equivalent of two light emitting layers is included in one pixel area.

8. The display device according to claim 1, wherein the first light emitting layer, the second light emitting layer, and the third light emitting layer each have a square shape with diagonal lines parallel in a row direction and diagonal lines parallel in the column direction, in a planar view.

* * * * *